(12) United States Patent
Hayama et al.

(10) Patent No.: US 7,676,908 B2
(45) Date of Patent: Mar. 16, 2010

(54) PRESSING MEMBER AND ELECTRONIC DEVICE HANDLING APPARATUS

(75) Inventors: Hisao Hayama, Tokyo (JP); Noboru Saito, Tokyo (JP); Makoto Sagawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 281 days.

(21) Appl. No.: 11/631,419

(22) PCT Filed: Jul. 9, 2004

(86) PCT No.: PCT/JP2004/009850

§ 371 (c)(1),
(2), (4) Date: Mar. 1, 2007

(87) PCT Pub. No.: WO2006/006220

PCT Pub. Date: Jan. 19, 2006

(65) Prior Publication Data

US 2008/0048158 A1 Feb. 28, 2008

(51) Int. Cl.
*H01R 43/00* (2006.01)
(52) U.S. Cl. ............................. 29/748; 29/747; 29/882; 324/765; 72/431; 72/474
(58) Field of Classification Search .................... 29/747, 29/748, 749, 751, 760, 761, 882, 884; 72/431, 72/442, 474, 475, 478
See application file for complete search history.

(56) References Cited

U.S. PATENT DOCUMENTS

| | | | | |
|---|---|---|---|---|
| 4,827,607 A | * | 5/1989 | Korsunsky et al. | 29/741 |
| 5,208,968 A | * | 5/1993 | Camsell et al. | 29/739 |
| 5,525,812 A | * | 6/1996 | Bandzuch et al. | 257/48 |
| 5,711,558 A | * | 1/1998 | Woody | 292/335 |
| 5,742,168 A | * | 4/1998 | Kiyokawa et al. | 324/754 |
| 6,104,183 A | * | 8/2000 | Kobayashi et al. | 324/158.1 |
| 6,188,042 B1 | * | 2/2001 | Sheen | 219/268 |
| 2002/0109518 A1 | * | 8/2002 | Saito et al. | 324/760 |

* cited by examiner

*Primary Examiner*—Derris H Banks
*Assistant Examiner*—Jeffrey Carley
(74) *Attorney, Agent, or Firm*—Posz Law Group, PLC

(57) ABSTRACT

A pusher 30 is composed of a pusher base 31 and a pressing body 32 attached to the pusher base 31 in a removable way. Specifically, a base portion of the pressing body 32 is provided with a flange portion 321, and the pusher base 31 is provided with a plate 33 having a U-shape when seen two-dimensionally. By sliding the pressing body 32 with respect to the pusher base 31 with the flange portion 321 of the pressing body 32 supported by the plate 33, the pressing body 32 can be attached to and removed from the pusher 30 without using any tools.

12 Claims, 13 Drawing Sheets

(a)

(b)

(a)

(b)

PRESSING MEMBER AND ELECTRONIC DEVICE HANDLING APPARATUS

TECHNICAL FIELD

The present invention relates to a pressing member for pressing an electronic device with a suitable load in an apparatus for testing the electronic device, such as an IC device, and an electronic device handling apparatus provided with such a pressing member.

BACKGROUND ART

In a production procedure of an electronic device, such as an IC device, an electronic device testing apparatus for testing performance and functions of a finally produced IC device and a device at its intermediate stage, etc. is necessary.

A test of an IC device by using an electronic device testing apparatus is performed, for example, as below. After conveying an IC device to be tested to above a test head provided with a socket, the IC device is pressed against the socket by a pusher, so that connection terminals of the socket are brought to contact with external terminals of the IC device. As a result, the IC device is electrically connected to a tester main body through the socket, the test head and a cable. Then, by applying to the IC device a test signal supplied from the tester main body to the test head via the cable and sending a response signal read from the IC device to the tester main body via the test head and the cable, electric characteristics of the IC device are measured.

In the above handler, the pusher for pressing the IC device to be tested against the socket is configured to press the IC device with a suitable load, so that the external terminals of the IC device surely contact with the connection terminals of the socket and the IC device to be tested and the connection terminals of the socket are not damaged.

Accordingly, if a thickness of the IC device is changed when changing a kind of the IC device, the pusher has to be replaced to a pusher corresponding to that.

DISCLOSURE OF THE INVENTION

Problem to be Solved by the Invention

In recent years, to improve the throughput, for example, 32, 64 or, furthermore, 128 of IC devices are tested at a time. In accordance therewith, the handler is provided with pushers by the same number as the number of IC devices measured at a time, and the pushers are fixed to an adapter normally with a bolt. Accordingly, a replacing operation of the pushers along with change of a kind of IC devices requires removing and attaching of a large number of pushers by using a wrench, which is very cumbersome. Particularly, when kinds of the IC devices increase, a load of the replacing operation of pushers as such becomes heavier.

The present invention was made in consideration of the above circumstances and has as an object thereof to provide a pressing member and an electronic device handling apparatus capable of easily responding to change of kinds of electronic devices and pressing the electronic devices with a suitable load.

Means for Solving the Problem

To attain the above object, according to a first aspect of the present invention, there is provided a pusher for pressing terminals of an electronic device to be tested against a contact portion of a test head in an electronic device handling apparatus, comprising a pressing body for contacting with the electronic device and a pusher base for supporting the pressing body; wherein the pressing body is attached to the pusher base in a removable way without using any tools (an invention 1).

According to the above invention (the invention 1), the pressing body can be replaced without using any tools, so that it is possible to easily respond to change of kinds of electronic devices and to press the electronic device with a suitable load by appropriately using a pressing body in accordance with a thickness of an electronic device.

In the above invention (the invention 1), preferably, the pressing body is pressed against a supporting member provided to the pusher base so as to support the pressing body by the pusher base or against the pusher base by a biasing member (an invention 2). According to the invention (the invention 2), the pressing body can be surely fixed to the pusher base.

In the above invention (the inventions 1 and 2), preferably, the pressing body is aligned with the pusher base by an alignment means (an invention 3). According to the invention (the invention 3), the pressing body can be surely aligned with the pusher base, so that it is possible to press an electronic device at a suitable position.

In the above invention (the invention 1), it may be configured that the pressing body is provided on its base portion with a flange portion, the pusher base is provided with a supporting portion for supporting the flange portion of the pressing body, and an opening portion is formed on a part of the supporting portion; and the pressing body can be attached to or removed from the pusher base by inserting the flange portion to the supporting portion from the opening portion of the supporting portion or by taking out the flange portion from the supporting portion (an invention 4).

In the above invention (the invention 4), preferably, the pusher base is provided with a protruding member biased to the pressing body side and capable of protruding to the pressing body side and receding to inside the pusher base (an invention 5). According to the invention (the invention 5), it is possible to press the flange portion of the pressing body against the supporting portion provided to the pusher base, consequently, the pressing body is surely fixed to the pusher base. Note that a ball of the ball plunger may be mentioned as an example of the protruding member, but it is not limited to that.

In the above invention (the invention 5), preferably, a recessed part for engaging with the protruding member provided to the pusher base is formed on the pressing body (an invention 6). According to the invention (the invention 6), the pressing body can be surely aligned with the pusher base as a result that the recessed part of the pressing body engages with the protruding member of the pusher base.

In the above invention (the invention 4), the pressing body is provided with a protruding member biased to the pusher base side and capable of protruding to the pusher base side and receding to inside the pressing body (an invention 7). According to the invention (the invention 7), the flange portion of the pressing body can be pressed against the supporting portion provided to the pusher base, so that the pressing body can be surely fixed to the pusher base.

In the above invention (the invention 7), preferably, a recessed part for engaging with the protruding member provided to the pressing body is formed on the pusher base (an invention 8). According to the invention (the invention 8), the pressing body can be surely aligned with the pusher base as a result that the recessed part of the pusher base engages with the protruding member of the pressing body.

In the above invention (the invention 4), it may be configured that, the pusher base is provided with a protruding member biased to the side to be provided with the pressing body and capable of protruding from a surface to be provided with the pressing body and receding to inside the pusher base; and the protruding member can be engaged with a side end portion of the pressing body positioned at a predetermined position in the pusher base (an invention 9).

In the above invention (the invention 9), the pressing body can be surely aligned with the pusher base as a result that the side end portion of the pusher base engages with the protruding member of the pusher base.

In the above invention (the invention 4), the supporting portion provided to the pusher base may press the pressing body to the pusher base side (an invention 10). According to the invention (the invention 10), the pressing body can be surely fixed to the pusher base.

In the above invention (the invention 10), the supporting portion provided to the pusher base may be composed of a supporting member being movable with respect to the pusher base; and the supporting member is biased to the pusher base side by an elastic body (an invention 11); and the supporting portion provided to the pusher base may be composed of a supporting member made of an elastic body; and the supporting member fixes the pressing body to the pusher base by an elastic force of the supporting member itself (an invention 12).

In the above invention (the invention 1), it may be configured that, the pressing body is provided with a convex portion protruding to the pusher base side; a space portion for the convex portion of the pressing body to fit in is formed in the pusher base; and the pressing body can be attached to and removed from the pusher base by inserting the convex portion of the pressing body to the space portion in the pusher base or by taking the same out from the space portion (an invention 13).

In the above invention (the invention 13), preferably, the pusher base is provided with a protruding member biased to the side of the wall portion facing to the protruding member in the space portion and capable of protruding to the space portion and receding to inside the pusher base (an invention 14). According to the invention (the invention 14), the convex portion of the pressing body can be pressed against one wall portion of the space portion in the pusher base, and the pressing body can be surely fixed to the pusher base.

In the above invention (the invention 14), preferably, a recessed part for engaging with the protruding member provided to the pusher base is formed on the convex portion of the pressing body (an invention 15). According to the invention (the invention 15), the pressing body can be surely aligned with the pusher base as a result that the recessed part of the convex portion of the pressing body engages with the protruding member of the pusher base.

According to a second aspect of the present invention, there is provided an electronic device handling apparatus for pressing terminals of an electronic device to be tested against a contact portion of a test head to conduct a test on the electronic device, comprising the pusher (the inventions 1-15) explained above (an invention 16).

Effect of the Invention

According to the pressing member and the electronic device handling apparatus of the present invention, the pressing body can be replaced without using any tools, so that by using a pressing body appropriately in accordance with a thickness of an electronic device, it is possible to easily respond to change of kinds of electronic devices and to press the electronic devices with a suitable load.

BEST MODE FOR CARRYING OUT THE INVENTION

Below, embodiments of the present invention will be explained in detail based on the drawings.

FIG. 1 is an overall view from the side of an IC device testing apparatus comprising a handler (hereinafter, referred to as a handler) according to an embodiment of the present invention; FIG. 2 is a perspective view of the handler according to the same embodiment; FIG. 3 is a sectional view of a key part in a test chamber of the handler according to the same embodiment; FIG. 4 is a disassembled perspective view showing the configuration around a pusher and socket in the handler according to the same embodiment. FIG. 5($a$) is a plan view, FIG. 5($b$) is a partial sectional view from the front, FIG. 5($c$) is a view of the bottom and FIG. 5($d$) is a sectional view of the pusher in the handler according to the same embodiment; FIG. 6 is a perspective view showing a matching plate in the handler according to the same embodiment; FIG. 7 is a sectional view around the pusher and socket in the handler according to the same embodiment; and FIG. 8 is a perspective view for explaining a replacing operation of the matching plate in the handler according to the same embodiment.

First, an overall configuration of the IC device testing apparatus provided with the handler according to an embodiment of the present invention will be explained. As shown in FIG. 1, the IC device testing apparatus 10 comprises a handler 1, a test head 5 and a main testing device 6. The handler 1 performs operations of successively conveying IC devices (an example of electronic devices) to be tested to a socket provided to the test head 5, classifying tested IC devices based on the test results, and storing on predetermined trays.

The socket provided to the test head 5 is electrically connected to the main testing device 6 through a cable 7, and the IC devices mounted on the socket in a removable way are brought to be connected to the main testing device 6 through the cable 7 to conduct a test on the IC devices by a testing electric signal from the main testing device 6.

Below the handler 1, there is a built-in control device for mainly controlling the handler 1 by partially leaving a space portion 8. The test head 5 is placed in the space portion 8 so as to be freely replaceable, and IC devices can be attached to the socket on the test head 5 through holes formed on the handler 1.

The handler 1 is an apparatus for testing IC devices as electronic devices to be tested under a higher temperature condition (high temperature) or a lower temperature condition (low temperature) than the normal temperature. The handler 1 comprises a chamber 100 composed of a constant temperature chamber 101, a test chamber 102 and an heat removing chamber 103 as shown in FIG. 2. The upper portion of the test head 5 shown in FIG. 1 is inserted to inside the test chamber 102 as shown in FIG. 3, where a test is conducted on the IC devices 2.

As shown in FIG. 2, the handler 1 of the present embodiment comprises an IC magazine 200 for holding pre-test IC devices and classifying and holding post-test IC devices, a loader section 300 for transferring IC devices to be tested sent from the IC magazine 200 to the chamber section 100, a chamber section 100 including the test head, and an unloader section 400 for taking out and classifying IC devices tested in the chamber section 100. The IC devices are held on the test tray to be conveyed.

A large number of the IC devices are held on a not shown customer tray before being set in the handler 1 and supplied in that state to the IC magazine 200 of the handler 1 shown in FIG. 2, and the IC devices 2 are reloaded from the customer tray to a test tray to be conveyed in the handler 1. Inside the handler 1, as shown in FIG. 3, the IC devices are moved in a state of being loaded on the test tray TST, given a thermal stress of a high temperature or a low temperature for testing (inspecting) whether or not they operate appropriately, and sorted in accordance with the test results. Below, inside of the handler 1 will be explained individually in detail.

First, a part relating to the IC magazine 200 will be explained.

As shown in FIG. 2, the IC magazine 200 is provided with a pre-test IC stocker 201 for holding IC devices before tested and a post-test IC stocker 202 for holding IC devices classified in accordance with the test results.

These pre-test IC stocker 201 and post-test IC stocker 202 comprise a frame-shaped tray support frame 203 and an elevator 204 capable of entering from under the tray support frame 203 and moving toward the top. The tray support frame 203 supports in it a plurality of stacked customer trays, and only the stacked customer trays are moved up and down by the elevator 204.

The pre-test IC stocker 201 shown in FIG. 2 holds stacked customer trays on which the IC devices to be tested are held. Also, the post-test IC stocker 202 holds stacked customer trays on which IC devices finished being tested and classified are held.

Secondary, a part relating to the loader section 300 will be explained.

The customer tray held in the pre-test IC stocker 201 is, as shown in FIG. 2, conveyed from the lower side of the apparatus board 105 to openings 306 on the loader section 300 by the tray transfer arm 205 provided between the IC magazine 200 and the apparatus board 105. Then, in the loader section 300, IC devices to be tested loaded on the customer trays are once transferred to the precisers 305 by X-Y conveyors 304, where mutual positions of the IC devices to be tested are corrected. Furthermore, the IC devices transferred to the precisers 305 are again reloaded on the test trays TST stopped on the loader section 300 by using the X-Y conveyors 304.

The X-Y conveyor 304 for reloading the IC devices from the customer tray to the test tray TST comprises, as shown in FIG. 2, two rails 301 laid over an apparatus board 105, a movable arm 302 capable of moving back and forth (this direction designated as the Y-direction) between the test tray TST and the customer tray by the two rails 301, and a movable head 303 supported by the movable arm 302 and capable of moving in the X-direction along the movable arm 302.

The movable head 303 of the X-Y conveyor 304 has a suction head attached facing downward. The suction head moves while drawing air to pick up the IC devices to be tested from the customer tray and reload the IC devices to be tested on the test tray TST.

Thirdly, a part relating to the chamber 100 will be explained.

The above explained test tray TST is loaded with IC devices to be tested at the loader section 300, then sent to the chamber 100, where the respective IC devices are tested in the state of being loaded on the test tray TST.

As shown in FIG. 2, the chamber 100 comprises a constant temperature chamber 101 for giving a thermal stress of a targeted high temperature or a low temperature to the IC devices to be tested loaded on the test tray TST, a test chamber 102 wherein the IC devices in a state of being given a thermal stress in the constant temperature chamber 101 are mounted on sockets on the test head 5, and an heat removing chamber 103 for removing the given thermal stress from the IC devices tested in the test chamber 102.

In the heat removing chamber 103, the IC devices are brought back to the room temperature by ventilation when a high temperature was applied in the constant temperature chamber 101, and brought back to a temperature of a degree not causing condensation by heating by a hot air or a heater, etc. when a low temperature was applied in the constant temperature chamber 101. Then, the IC devices brought to a normal temperature are taken out to the unloader section 400.

As shown in FIG. 3, the test head 5 is arranged at a lower portion in the test chamber 102 and the test tray TST is transferred to be on the test head 5. Note that inserts 16 (refer to FIG. 4) holding IC devices 2 are attached on the test tray TST, where all IC devices 2 held by the test tray TST are successively brought to electrically contact with the test head 5, and all IC devices 2 on the test tray TST are tested. On the other hand, the test tray TST finished the test is removed a thermal stress in the heat removing chamber 103, so that the temperature of the IC devices 2 is brought to the room temperature, then, taken out to the unloader section 400 shown in FIG. 2.

Also, as shown in FIG. 2, at an upper portion of the constant temperature chamber 101 and the heat removing chamber 103 is formed an inlet opening for taking in the test tray TST from the apparatus board 105 and an outlet opening for taking out the test tray TST to the apparatus board 105, respectively. On the apparatus board 105 are mounted test tray conveyors 108 for taking in and out the test tray TST to and from the openings. The conveyors 108 are composed of, for example, a rotation roller, etc. The test tray TST taken out from the heat removing chamber 103 is conveyed to the unloader section 400 by the test tray conveyor 108 provided on the apparatus board 105.

In the insert 16 of the present invention, as shown in FIG. 4, an IC holder 19 having a rectangular recessed shape for holding an IC device 2 is formed at the center. Also, at the center at both ends of the insert 16 are formed guide holes 20 for being inserted by later explained guide pins 35 of a pusher 30, and at the corner portions of the both ends of the insert 16 are formed mounting holes 21 for the mounting tabs of the test tray TST.

As shown in FIG. 4, a socket board 50 is arranged on the test head 5, and sockets 40 having probe pins 44 as connection terminals are fixed thereon. The probe pins 44 are provided by the number and pitches corresponding to those of connection terminals of the IC device 2 and biased upwardly by a not shown spring.

Also, as shown in FIG. 4, socket guides 41 are fixed on the socket board 50, so that the probe pins 44 provided on the socket 40 are exposed. On both sides of the socket guide 41, guide bushes 411 for being inserted two guide pins 35 formed on the pusher 30 are provided for aligning with the two guide pins 35. Also, four stopper portions 412 for regulating the lower limit of the pusher 30 are formed on the socket guide 41.

As shown in FIG. 3 and FIG. 4, pushers 30 are provided by the number corresponding to that of the sockets 40 on the upper surface of the test head 5. The pusher 30 according to the present embodiment comprises, as shown in FIG. 4 and FIG. 5, a pusher base 31 to be fixed to a later explained adapter 62 and a pressing body 32 attached to the center portion of the lower side of the pusher base 31.

At both end portions on the lower side of the pusher base 31, the guide pins 35 to be inserted to the guide holes 20 of the insert 16 and the guide bushes 411 of the socket guide 41 are provided; and at four corners on the lower side of the pusher base 31, there are provided stopper pins 36 capable of regulating the lower limit of the pusher 30 by contacting the stopper portions 412 of the socket guide 41 when the pusher 30 moves downwardly by being driven by the Z-axis drive 70.

Also, at the center portion on the lower side of the pusher base 31, a recessed part 311 having an approximately rectangular shape when seen two-dimensionally is formed to reach the front side (the upper side in FIG. 5(c)) of the pusher base 31. Along three sides of the recessed part 311, a plate 33 having a U-shape when seen two-dimensionally is fixed to the pusher base 31 with four pins 331. Three sides on the inner side of the plate 33 are provided so as to extend a little to the recessed part 311. A space between the recessed part 311 of the pusher base 31 and the plate 33 forms a pressing body supporting portion, which opens to the front side of the pusher base 31.

At the center portion of the pusher base 31, a ball plunger 34 is buried, so that a ball 341 on top thereof protrudes to the recessed part 311. The ball 341 of the ball plunger 34 is biased to the direction of the recessed part 311 of the pusher base 31 due to an action of a spring provided inside the ball plunger 34 and may recede into the ball plunger 34 (inside the pusher base 31) elastically by an outer force.

On the other hand, the pressing body 32 has a predetermined height corresponding to a thickness of the IC device 2 to be tested, and flange portion 321 is formed on four sides of the base portion having a rectangular shape when seen two-dimensionally of the pressing body 32 (a portion on the pusher base 31 side). A width of the base portion of the pressing body 32 is set slightly narrower than a width of the recessed part 311 of the pusher base 31, and a width of the flange portion 321 of the pressing body 32 is set to be approximately same as a width that the plate 33 provided on the pusher base 31 extends to the recessed part 311. A thickness of the flange portion 321 of the pressing body 32 is set to be slightly smaller than a depth of the recessed part 311 of the pusher base 31.

Also, at the center portion of the base portion of the pressing body 32, a recess hole 322 is formed to engage with the ball 341 of the ball plunger 34 provided on the pusher base 31. The ball plunger 34 and the recess hole 322 form a detent mechanism.

To attach the pressing body 32 to the pusher base 31, the base portion of the pressing body 32 is inserted to the recessed part 311 from the opening of the pressing body supporting portion of the pusher base 31 (the opening of the recessed part 311 on the front side of the pusher base 31) and the pressing body 32 is slid toward the center of the pusher base 31 with the flange portion 321 of the pressing body 32 held inside the recessed part 311 by the plate 33.

When the pressing body 32 reaches the center of the pusher base 31, the ball 341 of the ball plunger 34 engages with the recess hole 322 on the pressing body 32, so that the pressing body 32 is aligned. Also, since the ball 341 of the ball plunger 34 is biased to the pressing body 32 side, the pressing body 32 is fixed as a result that the flange portion 321 is pressed against the plate 33.

To remove the pressing body 32 from the pusher base 31, oppositely from the above, it is attained only by sliding the pressing body 32 to the direction of the opening of the pressing body supporting portion of the pusher base 31 (toward the front side of the pusher base 31). As explained above, the pressing body 32 can be attached to and removed from the pusher 31.

As shown in FIG. 3 and FIG. 6, the pusher 30 is fixed to and supported by the adapter 62 by using two bolts 63. As shown in FIG. 6, each adapter 62 is held by an attachment hole 61 on the matching plate 60, and the matching plate 60 is supported by rails R (refer to FIG. 8) provided on both end portions on the lower side of the drive plate 72 connected to the Z-axis drive 70. The matching plate 60 is supported by a drive plate 72, so that it positions above the test head 5 and allows the test tray TST to be inserted between the pusher 30 and the socket 40. Pushers 30 held by the matching plate 60 are movable freely in the direction of the test head 5 and the direction of the drive plate 72, that is in the Z-axis direction.

Note that the test tray TST is conveyed between the pusher 30 and the socket 40 from the vertical direction (Z-direction) with respect to the paper surface in FIG. 3. A conveyor roller, etc. may be used as a conveying means of the test tray TST inside the chamber 100. When conveying and moving the test tray TST, the drive plate 72 of the Z-axis drive 70 is elevated along the Z-axis, and a sufficient space for the test tray TST to be inserted is formed between the pusher 30 and the socket 40.

As shown in FIG. 3, pressing parts 74 are fixed to the lower surface of the drive plate 72 so as to be able to press the upper surface of the adapter 62 held by the matching plate 60. A drive axis 78 is fixed to the drive plate 72, a drive source, such as a motor, (not shown) is connected to the drive axis 78 to move the drive axis 78 up and down along the Z-axis, so that it is possible to press the adapter 62.

Note that the matching plate 60 is configured to be able to be freely replaced together with the adapter 62 and the pusher 30 in accordance with a shape of an IC device 2 to be tested and the number of sockets of the test head 5 (the number of IC devices 2 to be measured at a time), etc. As a result that the matching plate 60 is made replaceable, the Z-axis drive 70 can be multipurpose.

In the present embodiment, in the chamber 100 configured as above, as shown in FIG. 3, a temperature adjusting ventilator 90 is provided inside a tightly sealed casing 80 composing the test chamber 102. The temperature adjusting ventilator 90 comprises a fan 92 and a heat exchanger 94 and brings inside the casing 80 to be under a predetermined temperature condition (a high temperature or a low temperature) by drawing in an air inside the casing by the fan 92, letting it through the heat exchanger 94 and blowing to inside the casing 80 for circulation.

Fourthly, a part relating to the unloader section 400 will be explained.

The unloader section 400 shown in FIG. 2 is provided with X-Y conveyors 404 and 404 having the same configuration with that of the X-Y conveyor 304 provided to the loader section 300. Post-test IC devices are reloaded from the test tray TST conveyed out to the unloader section 400 to a customer tray by the X-Y conveyors 404 and 404.

As shown in FIG. 2, an apparatus board 105 of the unloader section 400 is provided with two pairs of windows 406 and 406 arranged so that the customer trays conveyed to the unloader section 400 can be brought close from below to the upper surface of the apparatus board 105.

Below each of the windows 406 is provided with an elevator 204 for elevating and lowering the customer tray, in which a customer tray becoming full after being reloaded with the post-test IC devices is placed and lowered, and the full tray is given to the tray transfer arm 205.

Next, a method of testing the IC device 2 in the IC device testing apparatus 10 explained above will be explained.

The IC devices 2 in a state of being loaded on the test tray TST, that is, being dropped to be held in the IC holders 19 of the inserts 16 shown in FIG. 4 are conveyed to inside the test chamber 102 after heated to a predetermined temperature in the constant temperature chamber 101.

When the test tray TST loaded with IC devices 2 stops above the test head 5, the Z-axis drive drives to bring the pressing parts 74 fixed to the drive plate 72 press against the pushers 30 via the adapters 62. Consequently, as shown in FIG. 7, the pressing body 32 of the pusher 30 presses a package body of the IC device 2 against the socket 40, so that connection terminals of the IC device 2 are connected to the probe pins 44 of the socket 40.

Here, downward movement of the pusher 30 is limited as a result that the stopper pins 36 of the pusher 30 contact the stopper portions 412 of the socket guide 41 and. Furthermore, since the pressing body 32 of the pusher 30 has a predetermined height corresponding to a thickness of the IC device 2 to be tested, the pusher 30 can press the IC device 2 against the socket 40 with a suitable load of not damaging the IC device 2 and the probe pins 44.

In this state, a test electric signal is transmitted from the main testing device 6 to the IC device 2 via the probe pins 44 of the test head 5. A response signal read from the IC device 2 is sent to the main testing device 6 through the test head 5 and, thereby, performance and functions, etc. of the IC device 2 are tested.

When a test on the IC device 2 finishes, the X-Y conveyor 404 stores the post-test IC device 2 on the customer tray based on the test results.

In the case of changing a kind of the IC device 2, when a thickness of the IC device 2 changes, as shown in FIG. 8, by opening a door D provided on the back side of the test chamber 102 of the handler 1, the matching plate 60 supported by the rails R of the drive plate 72 is taken out.

Then, the pressing body 32 of the pusher 30 held by the matching plate 60 is taken out from the pusher base 31, instead thereof, a pressing body 32 corresponding to a thickness of an IC device 2 of a changed kind is attached to the pusher base 31, and the matching plate 60 is pushed into the handler 1. Replacement of the pressing body 32 can be attained only by sliding the pressing body 32 on the pusher base 31 and a wrench or other tool is not necessary, so that it is possible to respond to change of a kind of an IC device 2 easily.

The embodiments explained above are described to facilitate understanding of the present invention and is not to limit the present invention. Accordingly, respective elements disclosed in the above embodiments include all design modifications and equivalents belonging to the technical scope of the present invention. For example, the pusher 30 according to the present embodiment may be modified as below.

FIRST MODIFICATION EXAMPLE

FIG. 9(a) is a plan view and FIG. 9(b) is a sectional view of a pusher according to another embodiment of the present invention. As in a pusher 30A shown in FIG. 9, a ball plunger 34A may be provided by being buried on a pressing body 32A side. In the pusher 30A, a ball 341A of the ball plunger 34A protrudes from the center portion of the base portion of the pressing body 32A to a pusher base 31A side. On the other hand, at the center of the recessed part 311 on the pusher base 31A, a recess hole 312A is formed to engage with the ball 341A of the ball plunger 34A provided on the pressing body 32A.

To attach the pressing body 32A to the pusher base 31A, the base portion of the pressing body 32A is inserted to the recessed part 311 from the opening thereof on the front side (the right side in FIG. 9(a)) of the pusher base 31A and slid to the center of the pusher base 31A.

When the pressing body 32A reaches the center of the pusher base 31A, the ball 341A of the ball plunger 34A provided to the pressing body 32A engages with the recess hole 312A on the pusher base 31A, so that the pressing body 32A is aligned. Also, since the ball 341A of the ball plunger 34A is biased to the pusher base 31A side, the pressing body 32A is fixed as a result a flange portion 321 thereof is pressed against the plate 33.

To take out the pressing body 32A from the pusher base 31A, oppositely from the above, it is sufficient if the pressing body 32A is slid to the front side of the pusher base 31A. As explained above, the pressing body 32A can be attached to and removed from the pusher 31A.

SECOND MODIFICATION EXAMPLE

FIG. 10(a) is a plan view and FIG. 10(b) is a sectional view of a pusher according to another embodiment of the present invention. As in a pusher 30B shown in FIG. 10, instead of the center of the recessed part 311 of the pusher base 31B, the ball plunger 34B may be provided by being buried at a position of engaging with the side end portion of the base portion of the pressing body 32B positioned at a predetermined position on the pusher base 31B. The pressing body 32B of the pusher 30B as above does not have to be provided with the recessed part to engage with the ball 341B of the ball plunger 34B To attach the pressing body 32B to the pusher base 31B, the base portion of the pressing body 32B is inserted to the recessed part 311 from the opening thereof on the front side (the right side in FIG. 10(a)) of the pusher base 31B and slid to the center of the pusher base 31B.

When the pressing body 32B reaches the center of the pusher base 31B and an end portion of the base portion of the pressing body 32B (the end portion positioning on the back side of the pusher base 31B) contacts the deepest bottom of the recessed part 311 of the pusher base 31B, the ball 341B of the ball plunger 34B engages with the side end portion of the base portion of the pusher base 31B (the end portion on the front side of the pusher base 31B), so that the pressing body 32B is aligned.

To take out the pressing body 32B from the pusher base 31B, oppositely from the above, it is sufficient if the pressing body 32B is slid to the front side of the pusher base 31B. As explained above, the pressing body 32B can be attached to and removed from the pusher 31B.

THIRD MODIFICATION EXAMPLE

FIG. 11(a) is a plan view of a pusher, FIG. 11(b) is a perspective view of a plate, and FIG. 11(c) is a sectional view of the pusher according to another embodiment of the present invention. As in a pusher 30C shown in FIG. 11, a plate 33C made of an elastic body (for example, plate spring member) may be used instead of using the ball plunger. As shown in FIG. 11(b), the plate 33C in the present embodiment has a U-shape when seen two-dimensionally, and two end portions 332C thereof have an approximate V-shape when seen from the side.

On the other hand, as shown in FIG. 11(a), the recessed part 311C on the pusher base 31C spreads to a width of the plate 33C on the front side (the right side in FIG. 11(c)) of the pusher base.

The plate 33C is fixed to the pusher base 31C by four pins 331, and the end portions 332C of the plate 33C in the present embodiment position in the recessed part 311C of the pusher base 31C spreading to the width of the plate 33C.

To attach the pressing body 32C to the pusher base 31C, the base portion of the pressing body 32C is inserted to the recessed part 311C from an opening thereof on the front side of the pusher base 31C and slid to the center of the pusher base 31C, with the flange portion 321 of the pressing body 32C kept in the recessed part 311 by the plate 33C.

When the pressing body 32C reaches the center of the pusher base 31C and an end portion of the base portion of the pressing body 32C (the end portion positioning on the back side of the pusher base 31C) contacts the deepest bottom of the recessed part 311C of the pusher base 31C, side end portions of the base portion of the pressing body 32C (the end portion on the front side of the pusher base 31C) engages with the end portions 332C of the plate 33C, so that the pressing body 32C is aligned. At this time, the end portions 332C of the plate 33C bias the pressing body 32C to the direction of the deepest bottom of the recessed part 311C of the pusher base 31C and to the upward direction, so that the pressing body 32C is fixed to the pusher base 31C.

To take out the pressing body 32C from the pusher base 31C, oppositely from the above, it is sufficient if the pressing body 32C is slid to the front side of the pusher base 31C. As explained above, the pressing body 32C can be attached to and removed from the pusher 31C.

Note that the end portions 332C of the plate 33C engages with the side end portion of the base portion of the pressing body 32C in the present embodiment, but the present invention is not limited to this and, for example, a groove portion may be provided on the flange portion 321 of the pressing body 32C, so that the groove engages with the end portions 332C of the plate 33C.

FOURTH MODIFICATION EXAMPLE

FIG. 12(a) is a plan view and FIG. 12(b) is a sectional view of a pusher according to another embodiment of the present invention. As in a pusher 30D shown in FIG. 12, a pressing body 32D may be fixed by elastically holding the plate 33D in a movable way with respect to the pusher base 31D without using the ball plunger. As shown in FIG. 12(b), the plate 33D is supported by four pins 37D penetrating the pusher base 31D and capable of sliding in the thickness direction of the pusher base 31D.

An upper end portion of each of the pins 37D protrudes to above the pusher base 31D, and a spring 38D for biasing the upper end portion of the pin 37D to the direction of separating from the pusher base 31D is provided between the upper end portion of the pin 37D and an upper surface of the pusher base 31D. Due to an elastic force of the spring 38D, the plate 33D is biased to the pusher base 31D side.

Note that a thickness of the flange portion 321D of the pressing body 32D in the present embodiment is set slightly larger than a depth of the recessed part 311 of the pusher base 31D.

To attach the pressing body 32D to the pusher base 31D, the base portion of the pressing body 32D is inserted to the recessed part 311D from an opening thereof on the front side of the pusher base 31D (the right side in FIG. 12(a)) and slid to the center of the pusher base 31D, with the flange portion 321D of the pressing body 32D kept in the recessed part 311 by the plate 33D.

When the pressing body 32D reaches the center of the pusher base 31D, an end portion of the base portion of the pressing body 32D (the end portion positioning on the back side of the pusher base 31D) contacts the deepest bottom of the recessed part 311 of the pusher base 31D, so that the pressing body 32D is aligned. At this time, since the plate 33D is biased to the pusher base 31D side by the spring 38D, the pressing body 32D is fixed to the pusher base 31D by a biasing force by the plate 33D.

To take out the pressing body 32D from the pusher base 31D, oppositely from the above, it is sufficient if the pressing body 32D is slid to the front side of the pusher base 31D. As explained above, the pressing body 32D can be attached to and removed from the pusher 31D.

FIFTH MODIFICATION EXAMPLE

FIG. 13(a) is a plan view of a pusher, FIG. 13(b) is a perspective view of a pressing body and FIG. 13(c) is a sectional view of the pusher according to another embodiment of the present invention. As in a pusher 30E shown in FIG. 13, the ball plunger 34E may be provided by being buried in the horizontal direction, so that a ball 341E of the ball plunger 34E protrudes to a space portion 313E (a quadratic prism shape in the present example) formed at the center of the pusher base 31E. The ball 341E of the ball plunger 34E in the pusher 30E is capable of receding to inside the pusher base 31E. Note that around the opening of the space portion 313E of the pusher base 31E in the present embodiment, a recessed part 311E having a rectangular shape when seen two-dimensionally is formed so as to be fitted with the base portion of the pressing body 32E.

On the other hand, the pressing body 32E is provided on top thereof with a convex portion 323E having a quadratic prism shape capable of fitting in the space portion 313E of the pusher base 31E, and one side wall of the convex portion 323E is formed with a recess hole 322E capable of engaging with the ball 341E of the plunger 34E provided to the pusher base 31E.

To attach the pressing body 32E to the pusher base 31E, the convex portion 323E of the pressing body 32E is inserted to the space portion 313E of the pusher base 31E. When the base portion of the pressing body 32E contacts the recessed part 311E of the pusher base 31E, a ball 341E of the ball plunger 34E provided to the pusher base 31E engages with the recess hole 322E of the convex portion 323E of the pressing body 32E, so that the pressing body 32E is aligned. Also, since the ball 341E of the ball plunger 34E is biased to the space portion 313E side of the pusher base 31E, the pressing body 32E is fixed as a result that the convex portion 323E of the pressing body 32E is pressed against one side wall of the space portion 313E of the pusher base 31E.

To take out the pressing body 32E from the pusher base 31E, oppositely from the above, it is sufficient if the convex portion 323E of the pressing body 32E is taken out from the space portion 313E of the pusher base 31E. As explained above, the pressing body 32E can be attached to and removed from the pusher 31E.

INDUSTRIAL APPLICABILITY

The pressing member and an electronic device handling apparatus of the present invention are useful for conducting tests effectively on a number of kinds of electronic devices.

EXPLANATION OF REFERENCES

Figure 1:
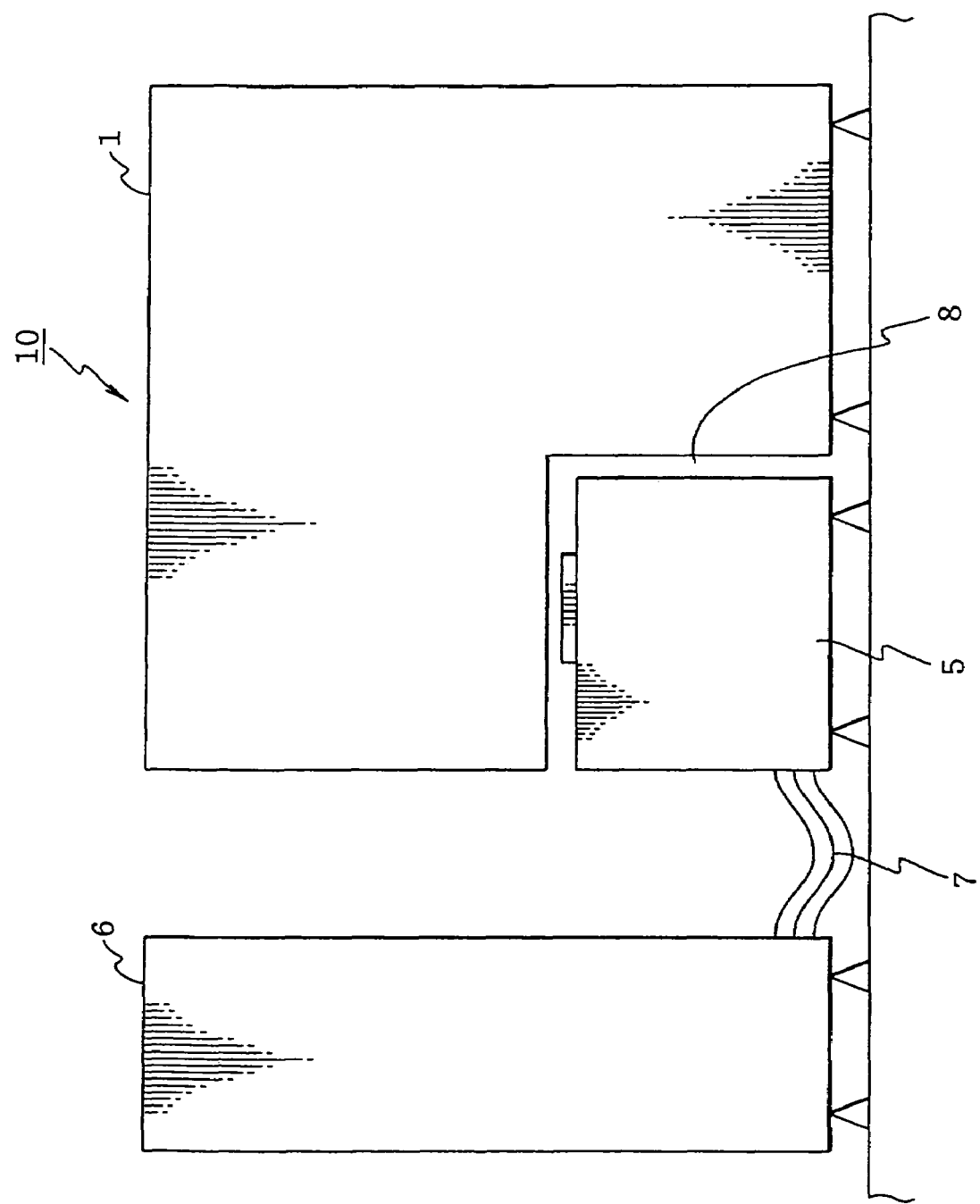
FIG. 1 is an overall view from the side of an IC device testing apparatus comprising a handler according to an embodiment of the present invention.
Figure 2:
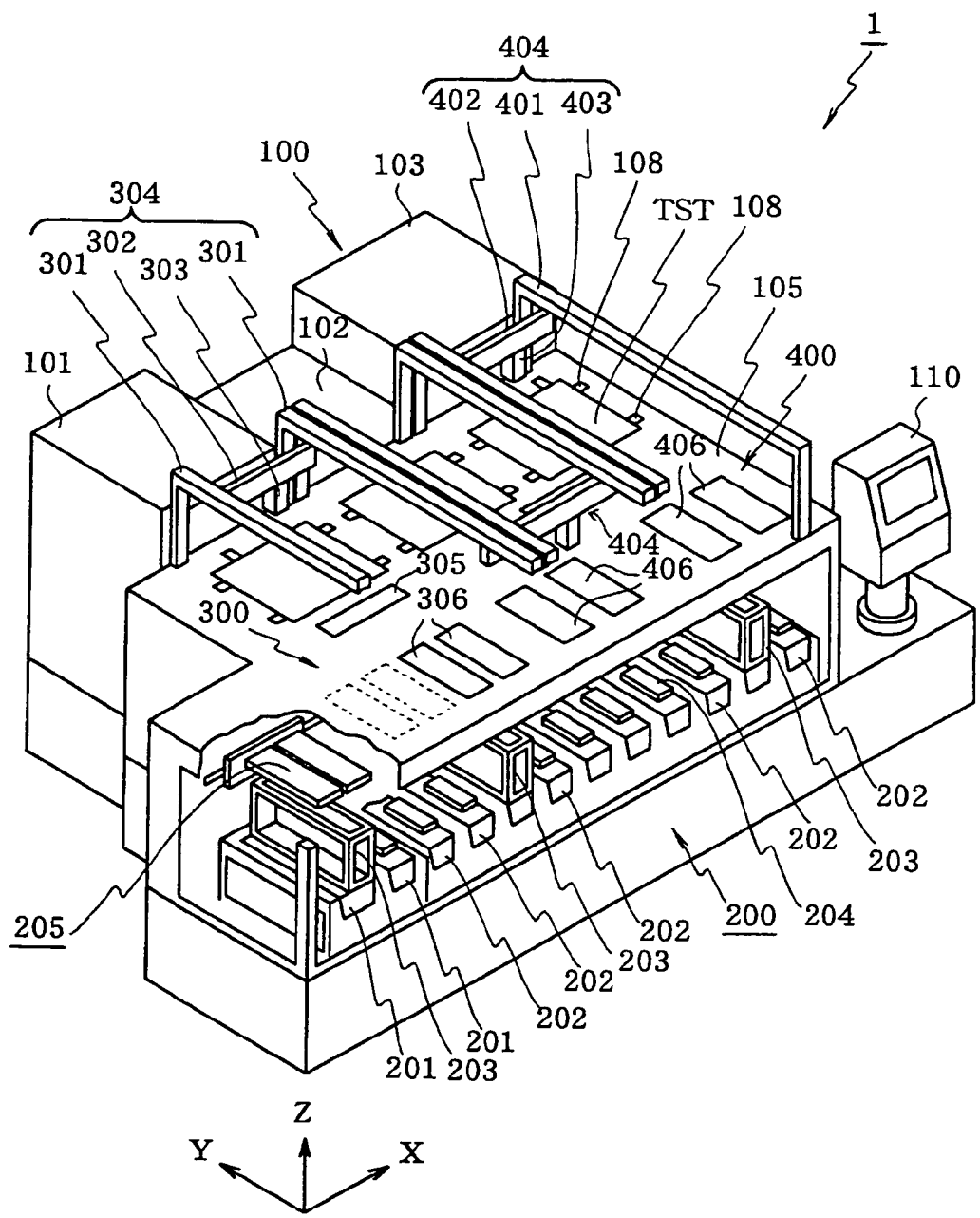
FIG. 2 is a perspective view of the handler according to the same embodiment.
Figure 3:
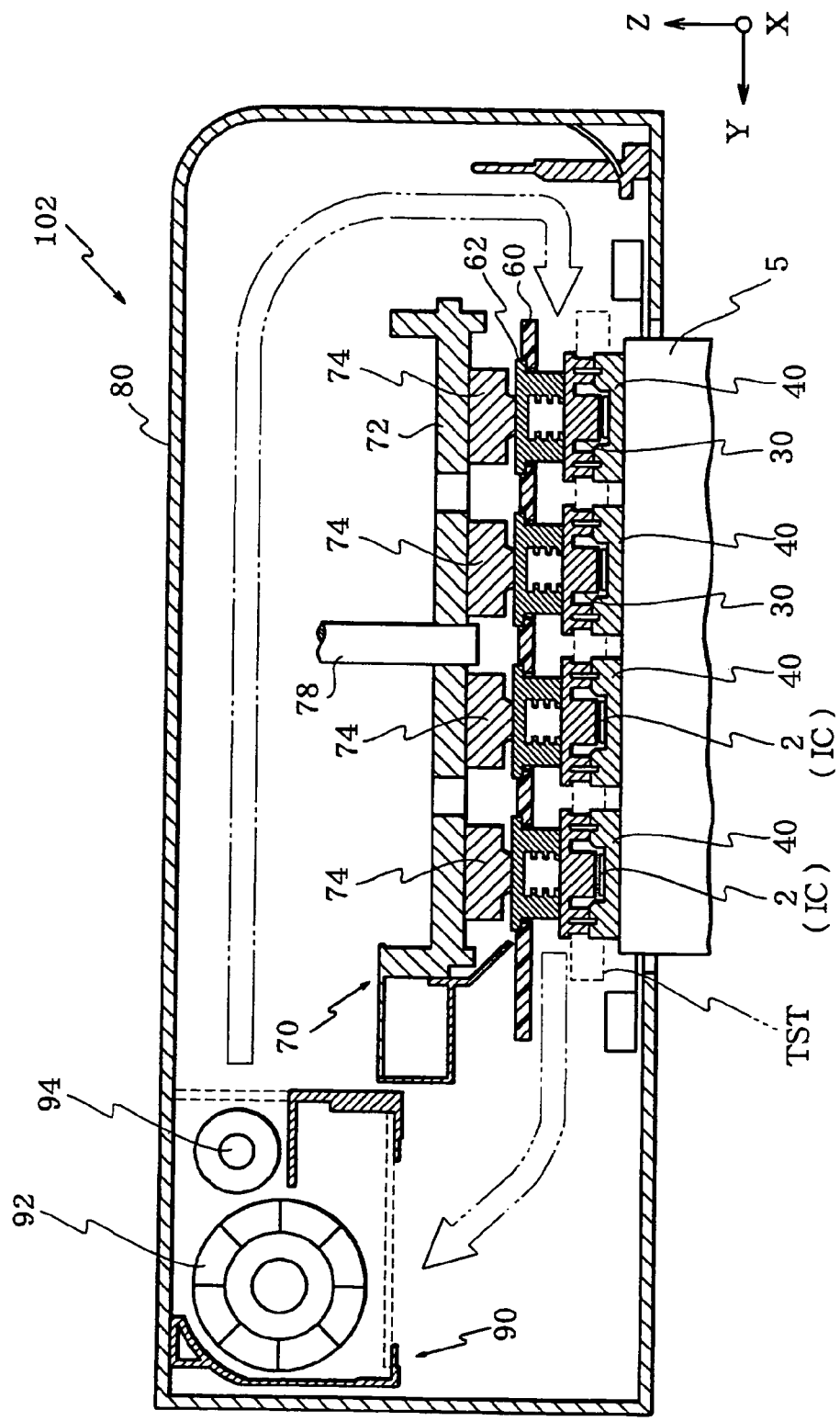
FIG. 3 is a sectional view of a key part in a test chamber of the handler according to the same embodiment.
Figure 4:
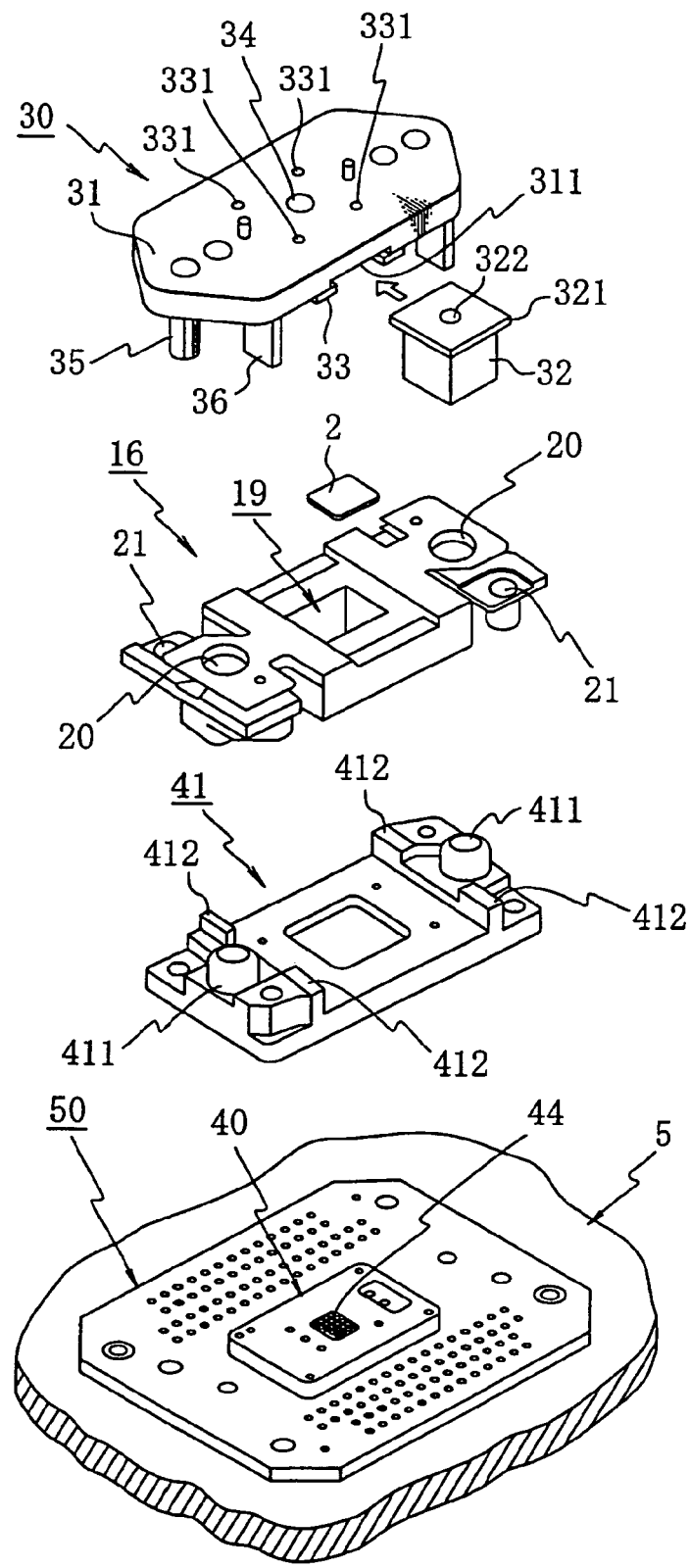
FIG. 4 is a disassembled perspective view showing the configuration around a pusher and socket in the handler according to the same embodiment.
Figure 5:
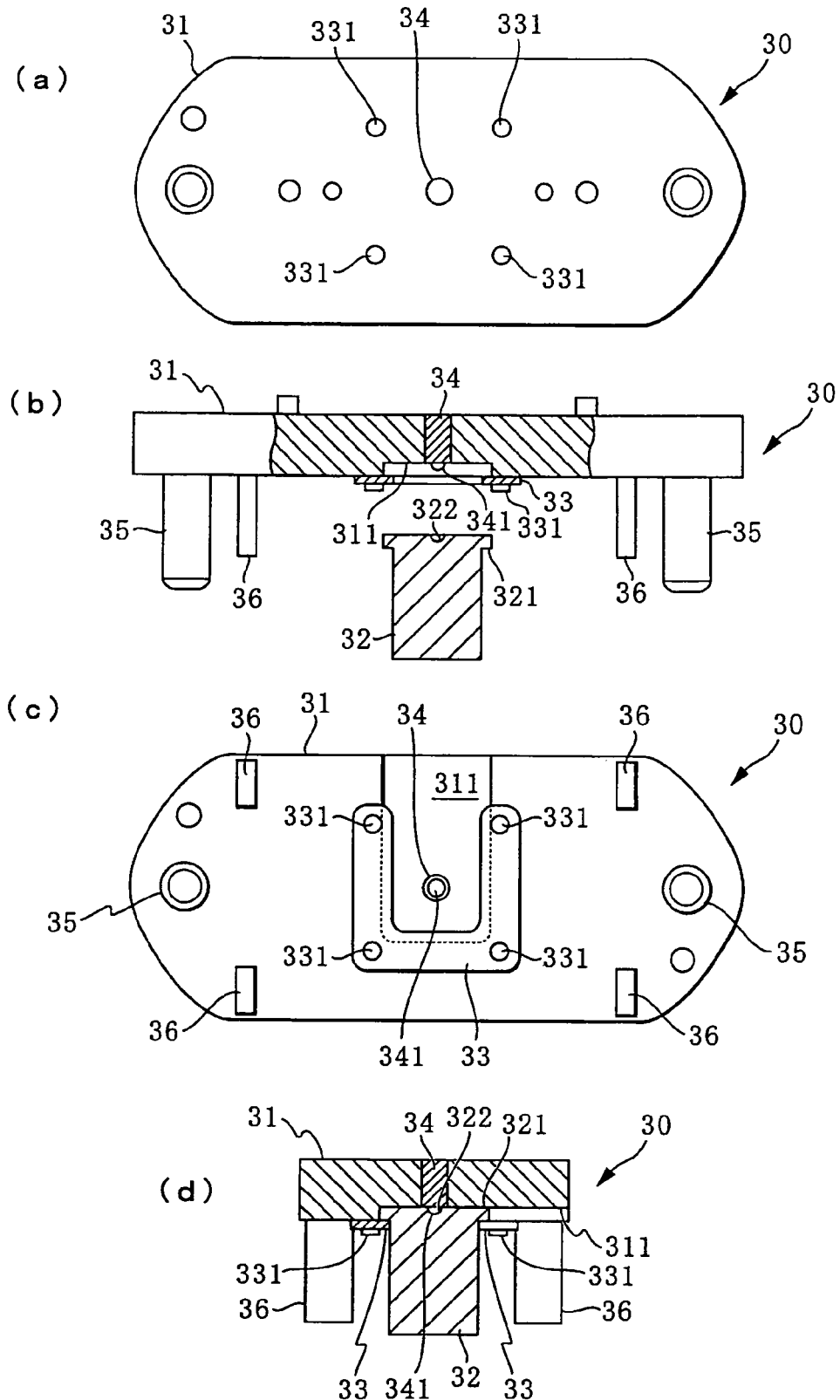
FIG. 5(a) is a plan view.
FIG. 5(b) is a partial sectional view from the front.
FIG. 5(c) is a view of the bottom and FIG. 5(d) is a sectional view of the pusher in the handler according to the same embodiment.
Figure 6:
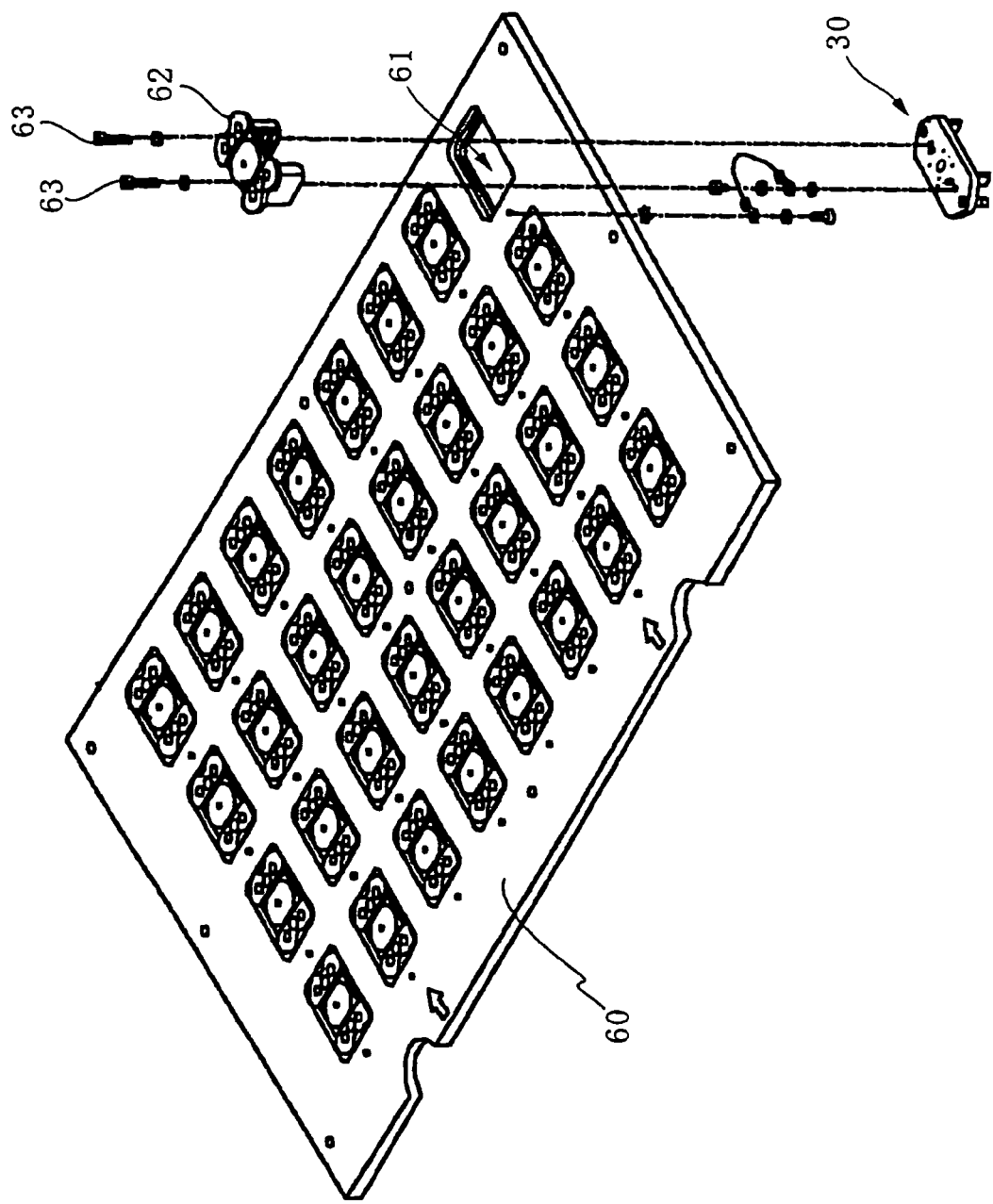
FIG. 6 is a perspective view showing a matching plate in the handler according to the same embodiment.
Figure 7:
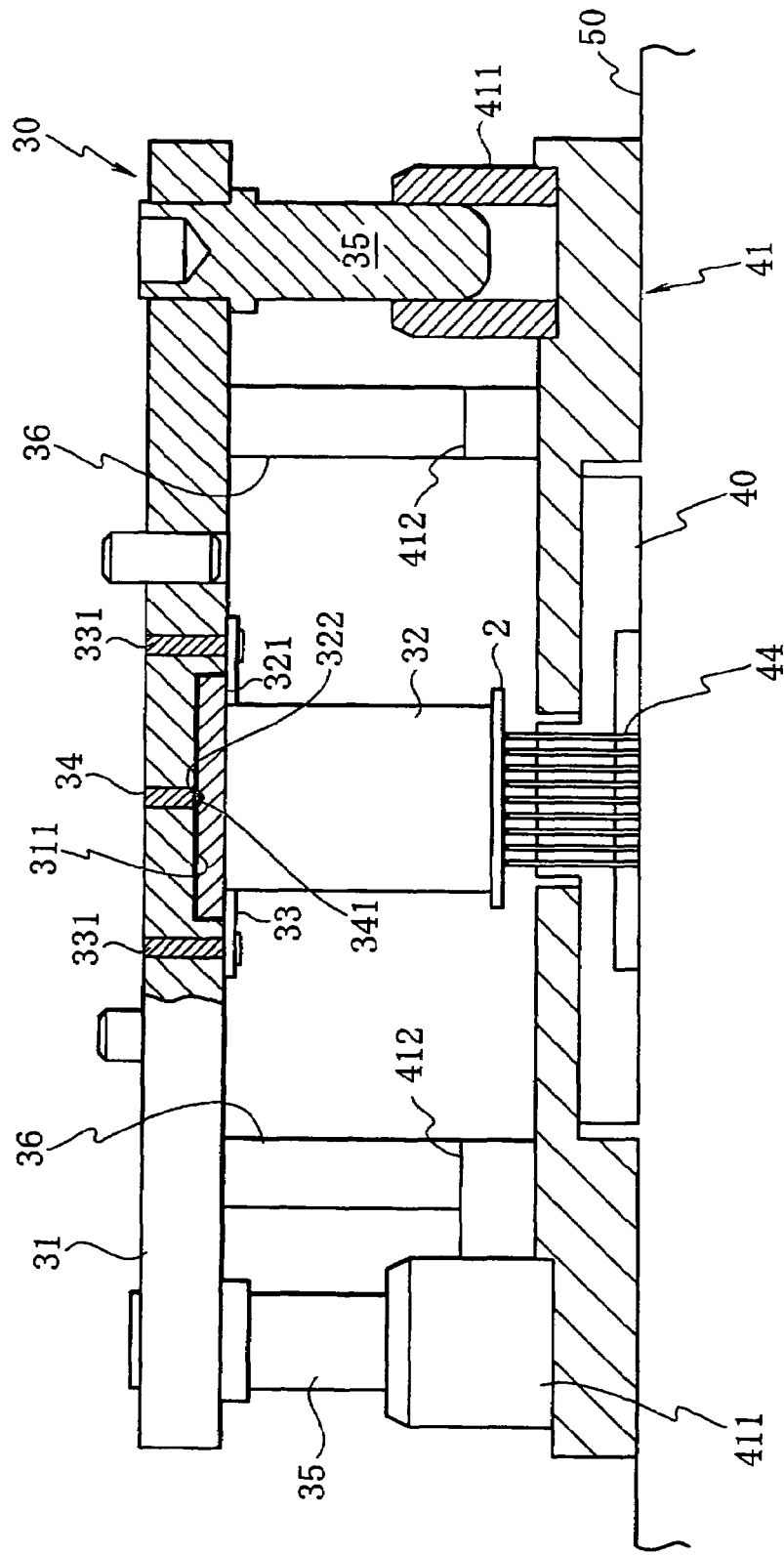
FIG. 7 is a sectional view around the pusher and socket in the handler according to the same embodiment.
Figure 8:
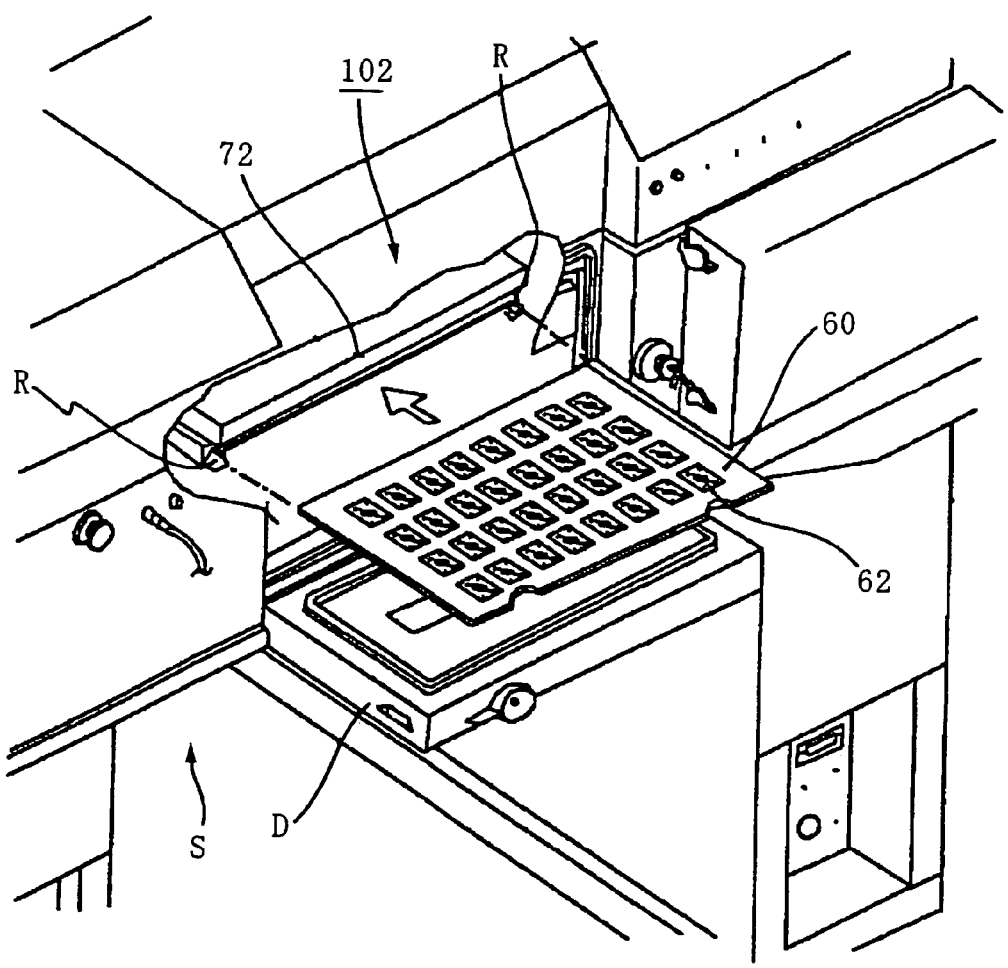
FIG. 8 is a perspective view for explaining a replacing operation of the matching plate in the handler according to the same embodiment.
Figure 8:
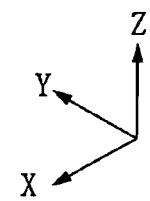
Figure 9:
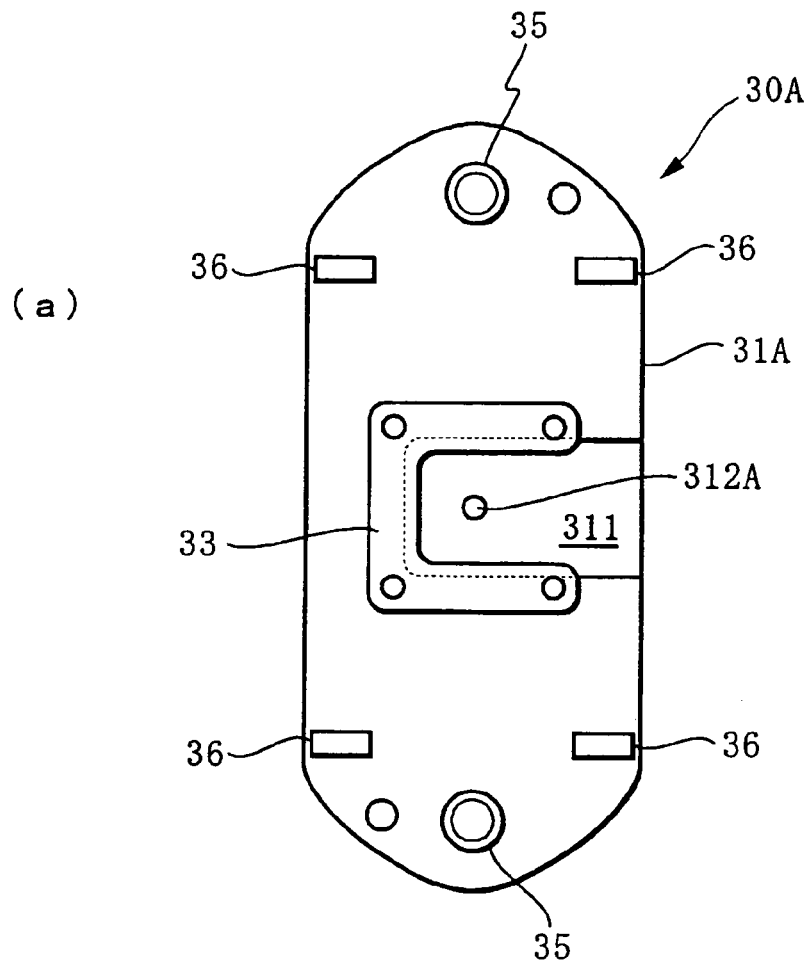
FIG. 9(a) is a plan view and FIG. 9(b) is a sectional view of a pusher according to another embodiment of the present invention.
Figure 9:
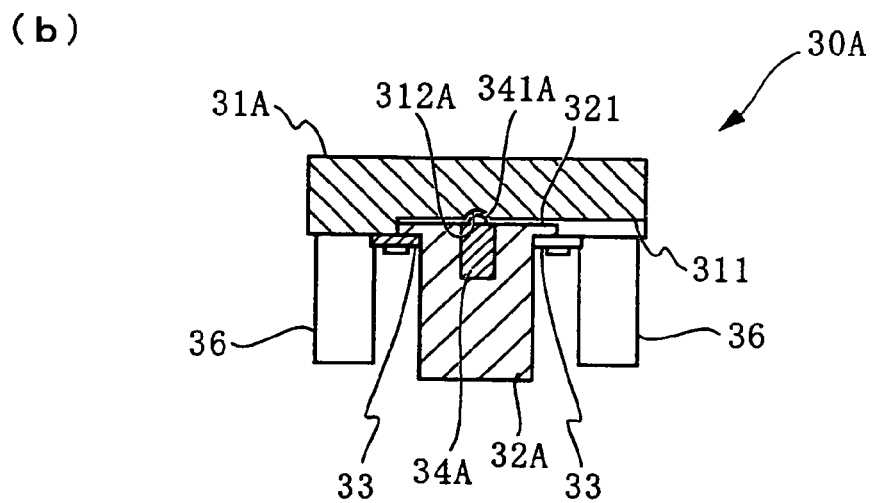
Figure 10:
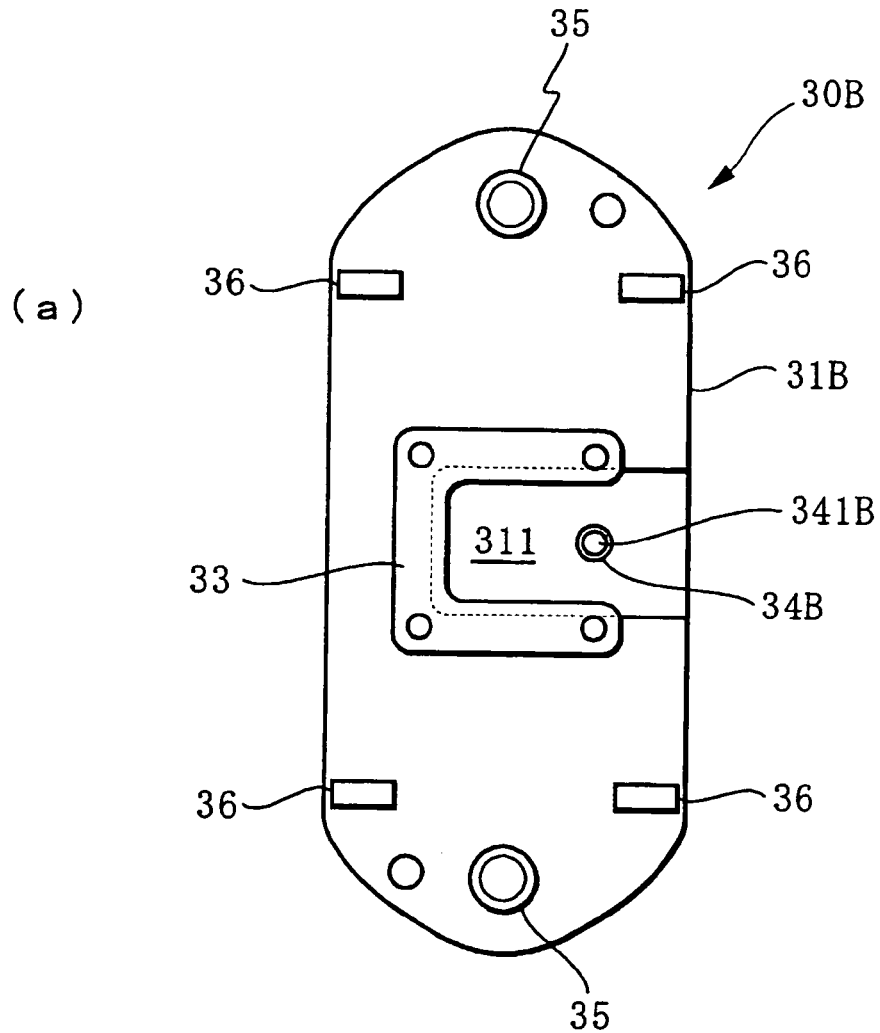
FIG. 10(a) is a plan view and FIG. 10(b) is a sectional view of a pusher according to another embodiment of the present invention.
Figure 10:
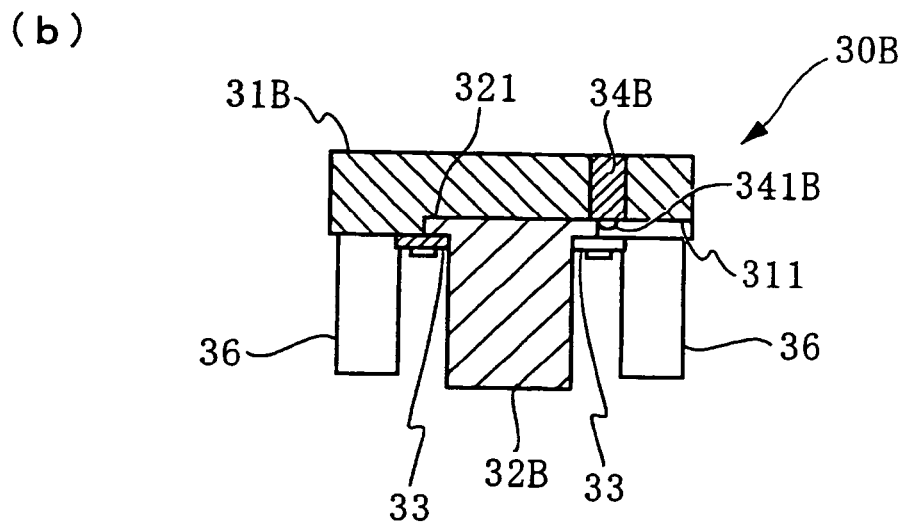
Figure 11:
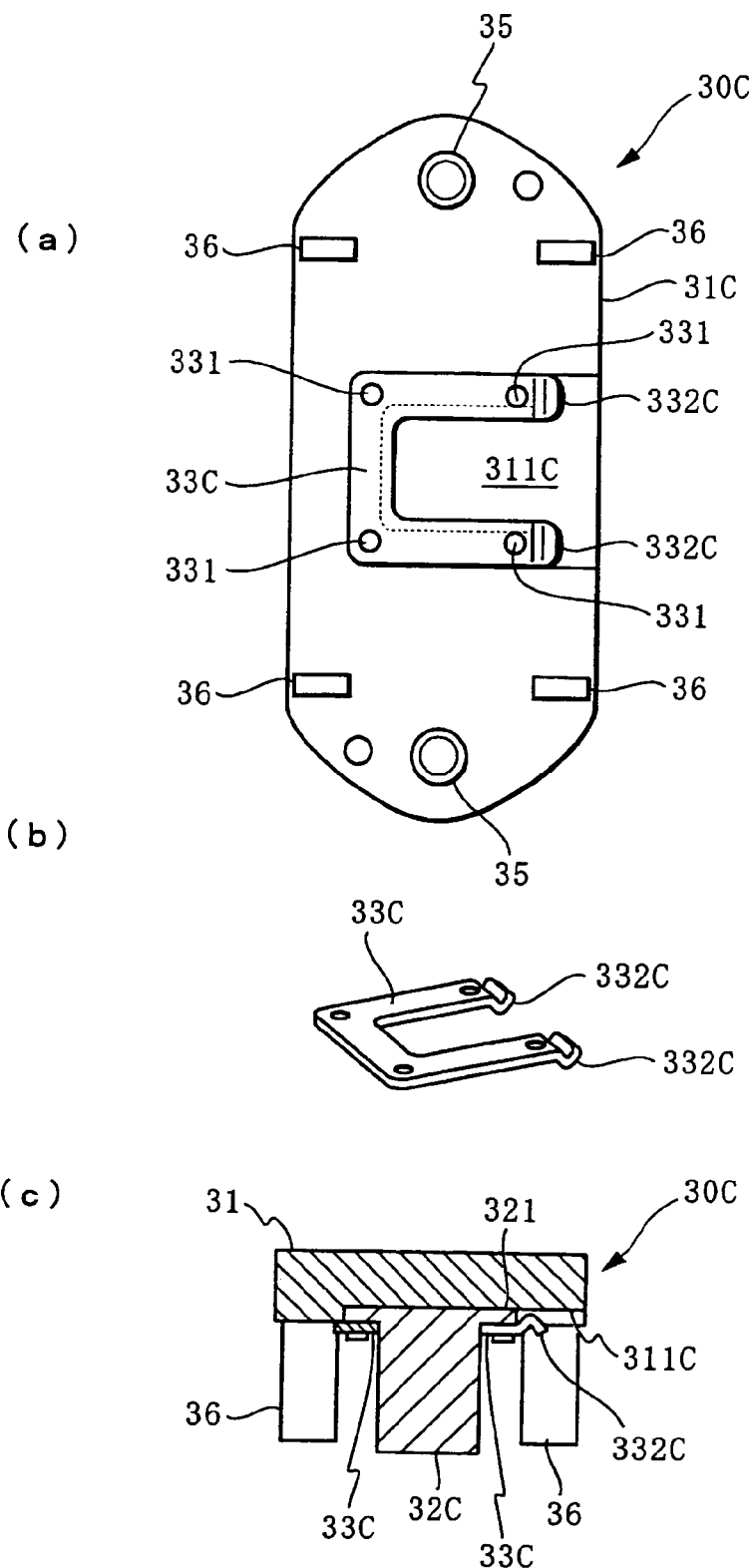
FIG. 11(a) is a plan view of a pusher.
FIG. 11(b) is a perspective view of a plate.
FIG. 11(c) is a sectional view of the pusher according to another embodiment of the present invention.
Figure 12:
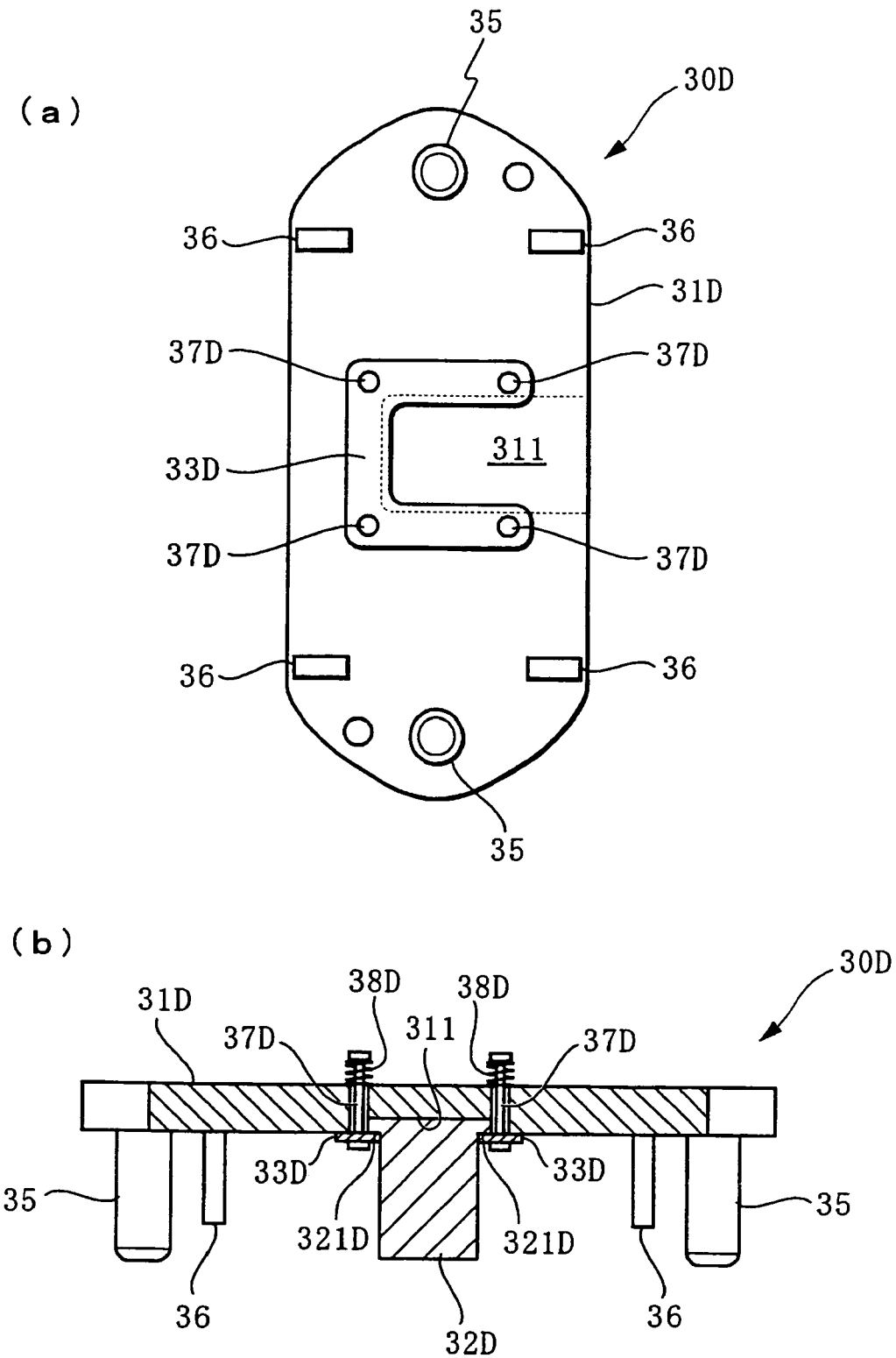
FIG. 12(a) is a plan view and FIG. 12(b) is a sectional view according to another embodiment of the present invention.
Figure 13:
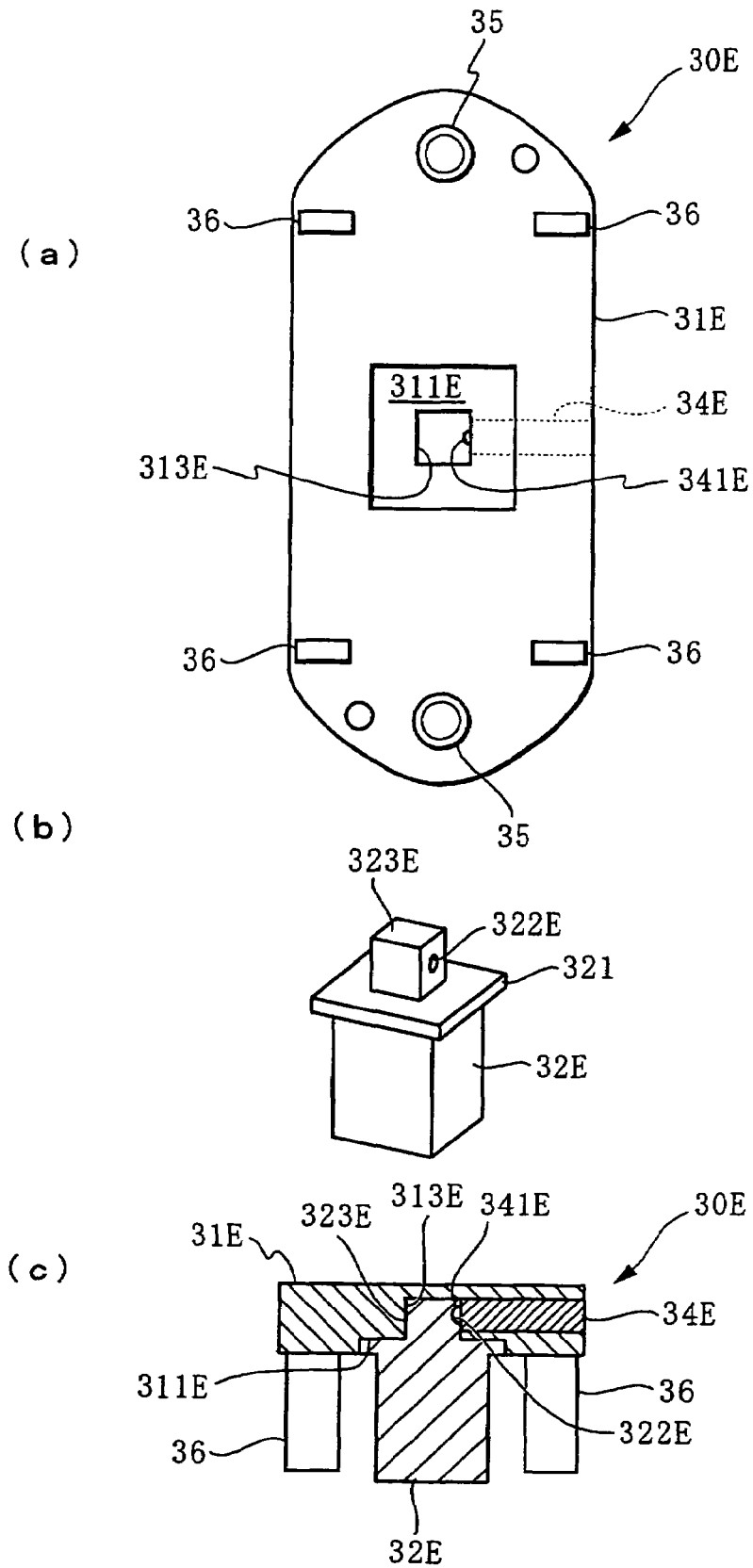
FIG. 13(a) is a plan view of a pusher.
FIG. 13(b) is a perspective view of a pressing body and FIG. 13(c) is a sectional view of the pusher according to another embodiment of the present invention.

1 . . . electronic device handling apparatus (handler)
10 . . . IC device (electronic device) testing apparatus
30, 30A, 30B, 30C, 30D, 30E . . . pusher
31, 31A, 31B, 31C, 31D, 31E . . . pusher base
32, 32A, 32B, 32C, 32D, 32E . . . pressing body
33, 33C, 33D . . . plate (supporting member)
34, 34A, 34B, 34E . . . ball plunger
341, 341A, 341B, 341E . . . ball (protruding member)

The invention claimed is:

1. A pusher for pressing terminals of an electronic device to be tested against a contact portion of a test head in an electronic device handling apparatus, wherein the pusher comprises a pressing body for contacting the electronic device and a pusher base for supporting said pressing body, wherein the pusher base is adapted to be coupled to and driven by a drive, and wherein said pressing body is attached to said pusher base in a removable way without using any tools, wherein
said pressing body is provided on its base portion with a flange portion;
said pusher base is provided with a supporting portion for supporting the flange portion of said pressing body, and an opening portion is formed on a part of said supporting portion;
said pressing body can be attached to or removed from said pusher base by inserting said flange portion into the supporting portion from the opening portion and by sliding said pressing body toward the center of the pusher base or by sliding said pressing body in a direction of the opening portion to remove said flange portion from said supporting portion; and
said pusher base is provided with a protruding member biased to said pressing body side and capable of protruding toward said pressing body and receding within said pusher base.

2. The pusher as set forth in claim 1, wherein a recessed part for engaging with the protruding member is formed on said pressing body.

3. A pusher for pressing terminals of an electronic device to be tested against a contact portion of a test head in an electronic device handling apparatus, wherein the pusher comprises a pressing body for contacting the electronic device and a pusher base for supporting said pressing body, wherein the pusher base is adapted to be coupled to and driven by a drive, and wherein said pressing body is attached to said pusher base in a removable way without using any tools, wherein
said pressing body is provided on its base portion with a flange portion;
said pusher base is provided with a supporting portion for supporting the flange portion of said pressing body, and an opening portion is formed on a part of said supporting portion;
said pressing body can be attached to or removed from said pusher base by inserting said flange portion into the supporting portion from the opening portion and by sliding said pressing body toward the center of the pusher base or by sliding said pressing body in a direction of the opening portion to remove said flange portion from said supporting portion; and
said pressing body is provided with a protruding member biased toward said pusher base and capable of protruding toward said pusher base and receding within said pressing body.

4. The pusher as set forth in claim 3, wherein a recessed part for engaging with the protruding member is formed on said pusher base.

5. A pusher for pressing terminals of an electronic device to be tested against a contact portion of a test head in an electronic device handling apparatus, wherein the pusher comprises a pressing body for contacting the electronic device and a pusher base for supporting said pressing body, wherein the pusher base is adapted to be coupled to and driven by a drive, and wherein said pressing body is attached to said pusher base in a removable way without using any tools, wherein
said pressing body is provided on its base portion with a flange portion;
said pusher base is provided with a supporting portion for supporting the flange portion of said pressing body, and an opening portion is formed on a part of said supporting portion;
said pressing body can be attached to or removed from said pusher base by inserting said flange portion into the supporting portion from the opening portion and by sliding said pressing body toward the center of the pusher base or by sliding said pressing body in a direction of the opening portion to remove said flange portion from said supporting portion;
said pusher base is provided with a protruding member biased toward the supporting portion, and the pusher base is capable of protruding from a surface of the pusher base on which the supporting portion is located and is capable of receding within said pusher base; and
said protruding member can be engaged with an end of said pressing body when the end of the pressing body is positioned at a predetermined position of said pusher base.

6. A pusher for pressing terminals of an electronic device to be tested against a contact portion of a test head in an electronic device handling apparatus, wherein the pusher comprises a pressing body for contacting the electronic device and a pusher base for supporting said pressing body, wherein the pusher base is adapted to be coupled to and driven by a drive, and wherein said pressing body is attached to said pusher base in a removable way without using any tools, wherein said pressing body is provided on its base portion with a flange portion;

said pusher base is provided with a supporting portion for supporting the flange portion of said pressing body, and an opening portion is formed on a part of said supporting portion;

said pressing body can be attached to or removed from said pusher base by inserting said flange portion into the supporting portion from the opening portion and by sliding said pressing body toward the center of the pusher base or by sliding said pressing body in a direction of the opening portion to remove said flange portion from said supporting portion;

the supporting portion presses said pressing body toward said pusher base;

the supporting portion is composed of a supporting member, which is movable with respect to said pusher base; and said supporting member is biased toward said pusher base by an elastic body.

7. A pusher for pressing terminals of an electronic device to be tested against a contact portion of a test head in an electronic device handling apparatus, wherein the pusher comprises a pressing body for contacting the electronic device and a pusher base for supporting said pressing body, wherein the pusher base is adapted to be coupled to and driven by a drive, and wherein said pressing body is attached to said pusher base in a removable way without using any tools, wherein said pressing body is provided on its base portion with a flange portion;

said pusher base is provided with a supporting portion for supporting the flange portion of said pressing body, and an opening portion is formed on a part of said supporting portion;

said pressing body can be attached to or removed from said pusher base by inserting said flange portion into the supporting portion from the opening portion and by sliding said pressing body toward the center of the pusher base or by sliding said pressing body in a direction of the opening portion to remove said flange portion from said supporting portion;

the supporting portion presses said pressing body toward said pusher base;

the supporting portion is composed of a supporting member made of an elastic body; and said supporting member fixes said pressing body to said pusher base by an elastic force of the supporting member itself.

8. A pusher for pressing terminals of an electronic device to be tested against a contact portion of a test head in an electronic device handling apparatus, wherein the pusher comprises a pressing body for contacting the electronic device and a pusher base for supporting said pressing body, wherein the pusher base is adapted to be coupled to and driven by a drive, and wherein said pressing body is attached to said pusher base in a removable way without using any tools, wherein said pressing body is provided with a convex portion protruding toward said pusher base;

a cavity, within which the convex portion of said pressing body fits, is formed in said pusher base; and said pressing body can be attached to and removed from said pusher base by inserting the convex portion of said pressing body into the cavity or by taking the same out from said cavity;

said pusher base is provided with a protruding member biased toward the cavity and capable of protruding into said cavity and receding within said pusher base; and said protruding member is embedded in a side wall of said cavity.

9. The pusher as set forth in claim 8, wherein a recessed part for engaging with the protruding member is formed on the convex portion of said pressing body.

10. The pusher according to one of claims 1, 2, 3, 4, 5, 6, 7, 8, and 9, wherein the pusher is part of an electronic device handling apparatus for pressing terminals of an electronic device to be tested against a contact portion of a test head to conduct a test on the electronic device.

11. The pusher as set forth in one of claims 1, 2, 3, 4, 5, 6, 7, 8, and 9, wherein the pusher base has a first main surface, which is adapted to be connected with a member that transfers a force from the drive, and a second main surface, which supports the pressing body.

12. The pusher as set forth in one of claims 1, 2, 3, 4, 5, 6, 7, 8, and 9, wherein the pusher is one of a plurality of identical pushers that are simultaneously driven by a drive to press terminals of electronic devices against a contact portion of a test head in a testing machine for testing the electronic devices.

* * * * *